United States Patent
Lee et al.

(10) Patent No.: US 11,670,393 B2
(45) Date of Patent: Jun. 6, 2023

(54) SEMICONDUCTOR DEVICES FOR CONTROLLING REPAIR OPERATIONS

(71) Applicant: SK hynix Inc., Icheon-si (KR)

(72) Inventors: Dong Beom Lee, Icheon-si (KR); Eun Je Kim, Icheon-si (KR); Hyeong Soo Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/525,315

(22) Filed: Nov. 12, 2021

(65) Prior Publication Data

US 2023/0041988 A1   Feb. 9, 2023

(30) Foreign Application Priority Data

Aug. 5, 2021   (KR) .......... 10-2021-0103266

(51) Int. Cl.
*G11C 8/12* (2006.01)
*G11C 29/02* (2006.01)

(52) U.S. Cl.
CPC .............. *G11C 29/027* (2013.01); *G11C 8/12* (2013.01)

(58) Field of Classification Search
CPC .................................. G11C 8/12; G11C 29/00
USPC ........................................................ 365/200
See application file for complete search history.

(56) References Cited

U.S. PATENT DOCUMENTS

| | | | | |
|---|---|---|---|---|
| 8,446,788 B2* | 5/2013 | Ong | ............ | G11C 29/04 365/201 |
| 9,293,227 B1* | 3/2016 | Takasugi | ............ | G11C 29/76 |
| 2009/0257296 A1* | 10/2009 | Ong | ............ | G11C 29/78 365/230.01 |
| 2019/0130993 A1* | 5/2019 | Kim | ............ | G11C 17/16 |
| 2020/0133517 A1 | 4/2020 | Shah et al. | | |

FOREIGN PATENT DOCUMENTS

KR   1020160091688 A   8/2016

* cited by examiner

*Primary Examiner* — Muna A Techane
(74) *Attorney, Agent, or Firm* — William Park & Associates Ltd.

(57) ABSTRACT

A semiconductor device includes a flag generation circuit configured to receive region fuse data and used fuse data which are generated from a fuse set selected based on a fuse set selection signal among from fuse sets and generate a bank resource flag to control a repair operation for a bank on which a repair operation has not been performed, based on the region fuse data and the used fuse data. The semiconductor device also includes a repair control circuit configured to control the repair operation for banks sharing the fuse sets based on the bank resource flag.

20 Claims, 20 Drawing Sheets

| FS_SEL<2:1> | SELECTED FUSE SET | BFD | UFD |
|---|---|---|---|
| '01' | FS1 | L | L |
| '10' | FS2 | L | L |
| '11' | FS3 | H | H |

FIG.9

| BFD | UFD | BLAT<1> | BLAT<2> | RSF<1> | RSF<2> |
|-----|-----|---------|---------|--------|--------|
| L | L | H | L | H | L |
| L | L | H | L | H | H |
| H | H | H | H | H | H |

FIG.11

| RSF<2> | RSF<1> | BLAT<1> | BLAT<2> | BRSF<1> | BRSF<2> |
|---|---|---|---|---|---|
| H | H | X | X | H | H |
| L | H | L | H | H | L |
| L | H | H | L | L | H |
| L | H | H | H | H | H |
| L | L | X | X | L | L |

SEMICONDUCTOR DEVICES FOR CONTROLLING REPAIR OPERATIONS

CROSS-REFERENCE TO RELATED APPLICATIONS

The present application claims priority under 35 U.S.C. 119(a) to Korean Patent Application No. 10-2021-0103266, filed on Aug. 5, 2021, which is incorporated herein by reference in its entirety.

BACKGROUND

1. Technical Field

Embodiments of the present disclosure relate to semiconductor devices for controlling repair operations.

2. Related Art

In general, in semiconductor devices, repair operations performed in various states are used to replace failed cells with redundancy cells. The repair operations used in the semiconductor devices may be performed in a wafer state or a package state. A repair operation performed in the package state is referred to as post package repair (PPR).

SUMMARY

According to an embodiment of the present disclosure, a semiconductor device includes a flag generation circuit configured to receive region fuse data and used fuse data which are generated from a fuse set selected based on a fuse set selection signal from among fuse sets and generate a bank resource flag to control a repair operation for a bank on which a repair operation has not been performed based on the region fuse data and the used fuse data. The semiconductor device also includes a repair control circuit configured to control a repair operation for banks sharing the fuse sets based on the bank resource flag.

In addition, according to another embodiment of the present disclosure, a semiconductor device includes a fuse data generation circuit configured to include a plurality of fuse sets each including at least one bank fuse, at least one address fuse, and a used fuse, and configured to generate region fuse data and used fuse data from a fuse set selected by a fuse set selection signal among the fuse sets. The semiconductor device also includes a flag generation circuit configured to generate a bank resource flag to control a repair operation for a bank on which a repair operation has not been performed, based on the region fuse data and the used fuse data.

BRIEF DESCRIPTION OF THE DRAWINGS

FIGS. 8 and 9 are diagrams illustrating an operation of the semiconductor device including the fuse data generation circuit illustrated in FIG. 7.

FIG. 11 is a table illustrating an operation of the bank resource flag generation circuit illustrated in FIG. 10.

DETAILED DESCRIPTION OF THE EMBODIMENTS

In the following description of embodiments, when a parameter is referred to as being "predetermined," it may be intended to mean that a value of the parameter is determined in advance when the parameter is used in a process or an algorithm. The value of the parameter may be set when the process or the algorithm starts or may be set during a period in which the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Hereinafter, various embodiments of the present disclosure will be described in detail with reference to the accompanying drawings. However, the embodiments described herein are for illustrative purposes only and are not intended to limit the scope of the present disclosure.

Figure 1:
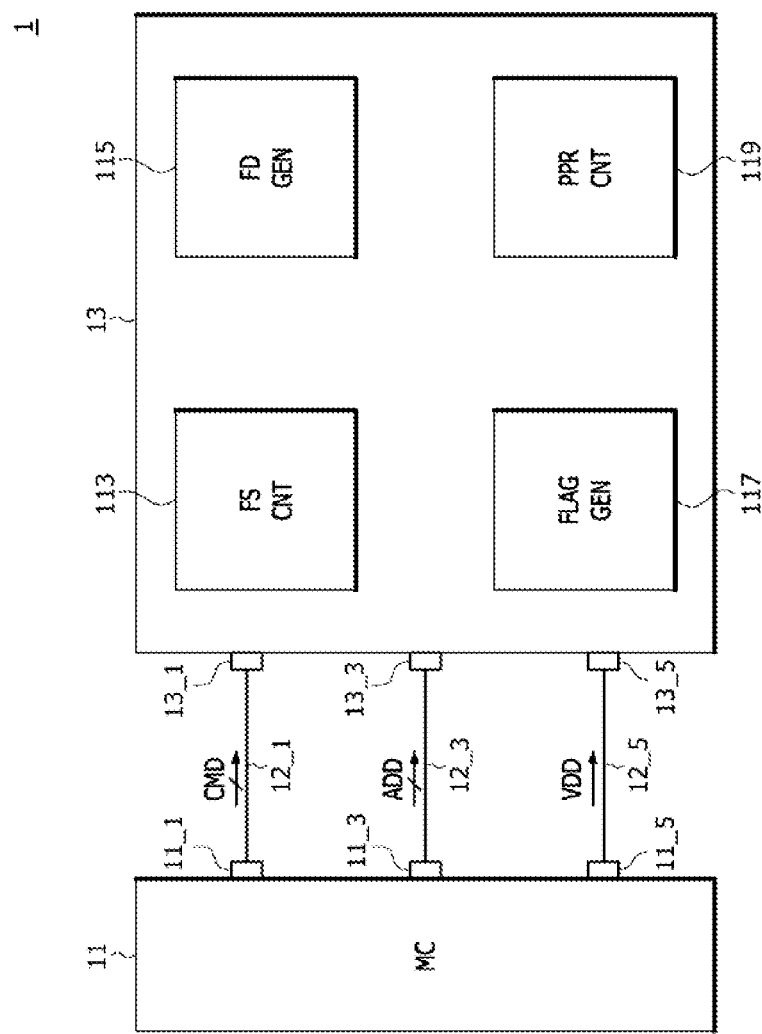
FIG. 1 is a block diagram illustrating a configuration of a semiconductor system according to an embodiment of the present disclosure.

FIG. 1 is a block diagram illustrating a configuration of a semiconductor system 1 according to an embodiment of the present disclosure. As illustrated in FIG. 1, the semiconductor system 1 may include a controller (MC) 11 and a semiconductor device 13. The controller 11 may include a first control pin 11_1, a second control pin 11_3, and a third control pin 11_5. The semiconductor device 13 may include a first device pin 13_1, a second device pin 13_3, and a third device pin 13_5. The controller 11 may transmit a command CMD to the semiconductor device 13 through a first transmission line 12_1 connected between the first control pin 11_1 and the first device pin 13_1. Each of the first control pin 11_1, the first transmission line 12_1, and the first device pin 13_1 may be implemented in a plural number according to the number of bits of the command CMD. The controller 11 may transmit an address ADD to the semiconductor device 13 through a second transmission line 12_3 connected between the second control pin 11_3 and the second device pin 13_3. Each of the second control pin 11_3, the second transmission line 12_3, and the second device pin 13_3 may be implemented in a plural number according to the number of bits of the address ADD. The controller 11 may transmit a power supply voltage VDD to the semiconductor device 13 through a third transmission line 12_5 connected between the third control pin 11_5 and the third device pin 13_5.

The semiconductor device 13 may receive the command CMD, the address ADD, and the power supply voltage VDD from the controller 11. The semiconductor device 13 may include a fuse set selection control circuit (FS CNT) 113 that generates a fuse set selection signal (FS_SEL of FIG. 2) for sequentially selecting a plurality of fuse sets (FS1~FSN of FIG. 4) shared by a plurality of banks (not shown) one by one when a boot-up operation is performed based on the power supply voltage VDD. The bank refers to a region composed of cell arrays accessed by a bank address (not shown) for a read operation and a write operation in the semiconductor device 13. Each of the plurality of banks may share the plurality of fuse sets (FS1~FSN of FIG. 4) in order to replace a failed cell array accessed by a failure address with a corresponding redundancy cell in a repair operation. According to an embodiment, each of the plurality of fuse sets (FS1~FSN of FIG. 4) may be shared by cell arrays having region sets different from the banks. The semiconductor device 13 may include the fuse sets (FS1~FSN of FIG. 4) shared by a plurality of banks, and may include a fuse data generation circuit (FD GEN) 115 generating bank fuse data (BFD of FIG. 2) and used fuse data (UFD of FIG. 2) from the fuse set selected based on the fuse selection signal (FS_SEL of FIG. 2). The semiconductor device 13 may include a flag generation circuit (FLAG GEN) 117 that generates a bank resource flag (BRSF of FIG. 2) including information on whether a repair operation can be performed for each bank based on the bank fuse data (BFD of FIG. 2) and the used fuse data (UFD of FIG. 2). The semiconductor device 13 may include a repair control circuit (PPR CNT) 119 that controls a repair operation on the banks based on the bank resource flag (BRSF of FIG. 2) when the repair operation is performed.

Figure 2:
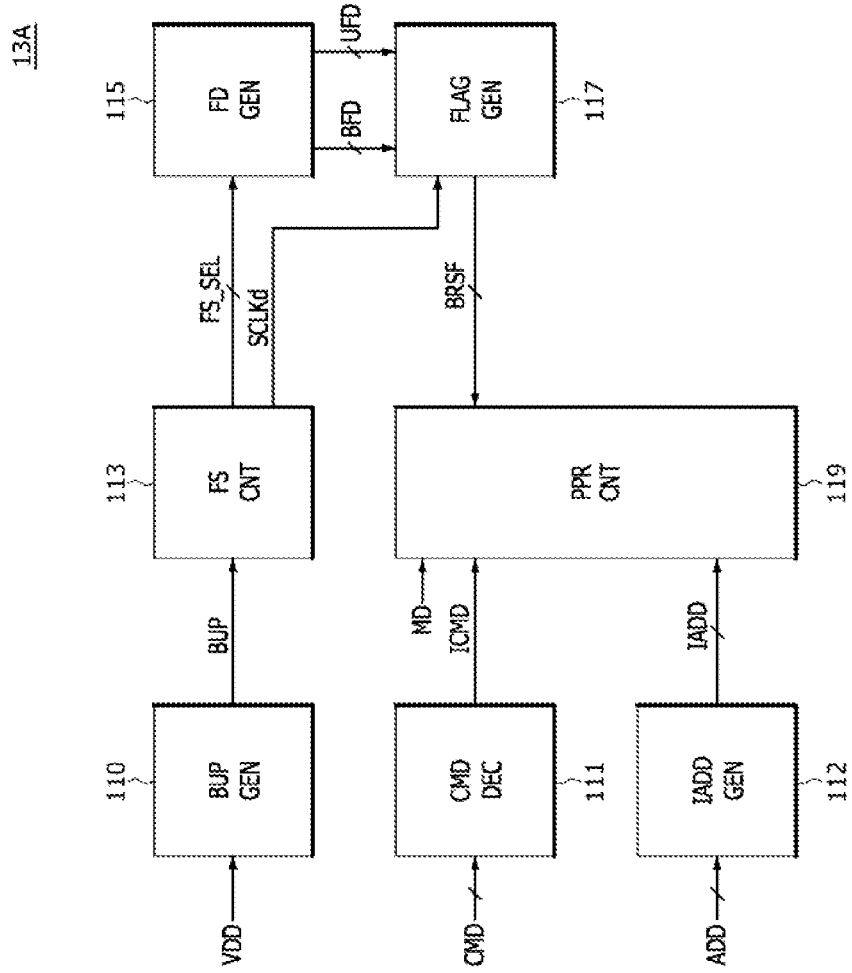
FIG. 2 is a block diagram illustrating a configuration according to an example of a semiconductor device included in the semiconductor system illustrated in FIG. 1.

FIG. 2 is a block diagram illustrating a configuration of a semiconductor device 13A according to an example of the semiconductor device 13 included in the semiconductor system 1 illustrated in FIG. 1.

The semiconductor device 13A may include a boot-up pulse generation circuit (BUP GEN) 110, a command decoder (CMD DEC) 111, an internal address generation circuit (IADD GEN) 112, a fuse set selection control circuit (FS CNT) 113, a fuse data generation circuit (FD GEN) 115, a flag generation circuit (FLAG GEN) 117, and a repair control circuit (PPR CNT) 119.

The boot-up pulse generation circuit 110 may generate a boot-up pulse BUP based on the power supply voltage VDD. The boot-up pulse generation circuit 110 may generate the boot-up pulse BUP for performing a boot-up operation after a power-up period set based on the power supply voltage VDD is completed. The power-up period may be set as a period from a point in time when the power supply voltage VDD is applied to a point in time when the power supply voltage VDD rises to a preset level. The boot-up operation may be performed to generate bank fuse data BFD and used fuse data UFD from the plurality of fuse sets (FS1 to FSN of FIG. 4) included in the fuse data generation circuit 115.

The command decoder 111 may generate an internal command ICMD based on the command CMD. The command decoder 111 may decode the command CMD to generate the internal command ICMD for performing an internal operation of the semiconductor device 13A. In this embodiment, the internal operation of the semiconductor device 13A may be set as an active operation for accessing a cell array included in a bank (not shown), but may be set as another internal operation according to an embodiment.

The internal address generation circuit 112 may generate an internal address IADD based on the address ADD. The internal address generation circuit 112 may decode the address ADD to generate the internal address IADD including address information on a failed cell array for a repair operation. The address information on the failed cell array may include a bank address for accessing a bank including the failed cell array and an address for accessing the failed cell array.

The fuse set selection control circuit 113 may receive the boot-up pulse BUP from the boot-up pulse generation circuit 110. The fuse set selection control circuit 113 may generate a selection clock SCLK when a boot-up operation is performed based on the boot-up pulse BUP and may generate a fuse set selection signal FS_SEL for sequentially selecting one of the plurality of fuse sets (FS1~FSN of FIG. 4) shared by a plurality of banks (not shown) one by one in synchronization with the selection clock SCLK. For example, when two banks (not shown) share three fuse sets (FS1~FS3 of FIG. 7), the fuse set selection control circuit 113 may generate the fuse set selection signal FS_SEL having a first logic bit set in order to select the first fuse set FS1, may generate the fuse set selection signal FS_SEL having a second logic bit set in order to select the second fuse set FS2, and may generate the fuse set selection signal FS_SEL having a third logic bit set in order to select the third fuse set FS3. Each of the first to third logic bit sets may be set in various ways according to embodiments according to a combination of logic levels of each of the bits included in the fuse set selection signal FS_SEL. The fuse set selection control circuit 113 may delay the selection clock SCLK to generate a delay selection clock SCLKd. The fuse set selection control circuit 113 may delay the selection clock SCLK so that the delay selection clock SCLKd is generated after the bank fuse data BFD and the used fuse data UFD are generated by the fuse data generation circuit 115.

The fuse data generation circuit 115 may receive the fuse set selection signal FS_SEL from the fuse set selection control circuit 113. The fuse data generation circuit 115 may include a plurality of fuse sets (FS1~FSN of FIG. 4) and may generate the bank fuse data BFD and the used fuse data UFD from the fuse set selected based on the fuse set selection signal FS_SEL among the plurality of fuse sets (FS1~FSN of FIG. 4). The logic level of the bank fuse data BFD may be determined according to whether at least one of the bank fuses (BF of FIG. 4) included in the fuse set selected based on the fuse set selection signal FS_SEL is cut. The logic level of the used fuse data UFD may be determined according to whether the used fuse (UF of FIG. 4) included in the fuse set selected based on the fuse set selection signal FS_SEL is cut.

The flag generation circuit 117 may receive the delay selection clock SCLKd from the fuse set selection control circuit 113 and may receive the bank fuse data BFD and the used fuse data UFD from the fuse data generation circuit 115. The flag generation circuit 117 may extract information on a bank on which a repair operation has been performed and information on an unused fuse set from the bank fuse data BFD and the used fuse data UFD based on the delay selection clock SCLKd and may generate a bank resource flag BRSF including information on whether a repair operation can be performed for each bank based on the extracted information.

The repair control circuit 119 may receive the internal command ICMD from the command decoder 111, may receive the internal address IADD from the internal address generation circuit 112, and may receive the bank resource flag BRSF from the flag generation circuit 117. The repair control circuit 119 may extract information on the bank including the failed cell array from the internal address IADD when a repair operation is performed based on the mode signal MD and the internal command ICMD and may control the repair operation for the bank including the failed cell array based on the bank resource flag BRSF. The mode signal MD is a signal activated for the repair operation and may be applied to the semiconductor device 13A from outside or generated inside the semiconductor device 13A. The mode signal MD may be set as a signal set by a mode register set operation. The repair control circuit 119 may perform a rupture operation of storing information on an address for accessing the failed cell array in the fuse set when a repair operation is performed on a bank including the failed cell array based on the bank resource flag BRSF. The rupture operation may be performed by electrically cutting each of a plurality of address fuses (AF of FIG. 4) included in the fuse set.

Figure 3:
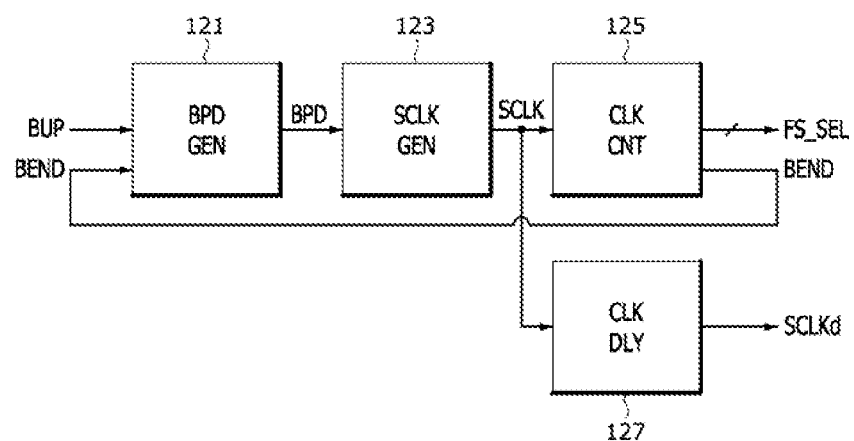
FIG. 3 is a block diagram illustrating a configuration according to an example of a fuse set selection control circuit included in the semiconductor device illustrated in FIG. 2.

FIG. 3 is a block diagram illustrating a configuration according to an example of the fuse set selection control circuit 113 included in the semiconductor device 13A illustrated in FIG. 2. As illustrated in FIG. 3, the fuse set selection control circuit 113 may include a boot-up period signal generation circuit (BPD GEN) 121, a selection clock generation circuit (SCLK GEN) 123, a clock counter (CLK CNT) 125, and a clock delay unit (CLK DLY) 127.

The boot-up period signal generation circuit 121 may receive the boot-up pulse BUP from the boot-up pulse generation circuit 110 and may receive a boot-up end signal BEND from the clock counter 125. The boot-up period signal generation circuit 121 may generate a boot-up period signal BPD that is activated during the boot-up operation being performed based on the boot-up pulse BUP and the boot-up end signal BEND. The boot-up period signal generation circuit 121 may generate the boot-up period signal BPD, which is activated when the boot-up pulse BUP is generated. The boot-up period signal generation circuit 121 may generate the boot-up period signal BPD, which is inactivated when the boot-up end signal BEND is activated.

The selection clock generation circuit 123 may receive the boot-up period signal BPD from the boot-up period signal generation circuit 121. The selection clock generation circuit 123 may generate a selection clock SCLK based on the boot-up period signal BPD. The selection clock generation circuit 123 may generate the selection clock during the boot-up operation of activating the boot-up period signal BPD is performed.

The clock counter 125 may receive the selection clock SCLK from the selection clock generation circuit 123. The clock counter 125 may count the selection clock SCLK to generate the fuse set selection signal FS_SEL whose logic bit set is sequentially varied. For example, the clock counter 125 may generate the fuse set selection signal FS_SEL having a first logic bit set in synchronization with a first rising edge of the selection clock SCLK, may generate the fuse set selection signal FS_SEL having a second logic bit set in synchronization with a second rising edge of the selection clock SCLK, and may generate the fuse set selection signal FS_SEL having a third logic bit set in synchronization with a third rising edge of the selection clock SCLK. Here, the rising edge may be defined as a point in time or period of transition from a logic "low" level to a logic "high" level. The clock counter 125 may generate the boot-up end signal BEND when the fuse set selection signal FS_SEL having a preset logic bit set is generated. For example, the clock counter 125 may generate the boot-up end signal BEND, which is activated when the fuse set selection signal FS_SEL having a fourth logic bit set is generated in synchronization with a fourth rising edge of the selection clock SCLK.

The clock delay unit 127 may receive the selection clock SCLK from the selection clock generation circuit 123. The clock delay unit 127 may generate the delay selection clock SCLKd by delaying the selection clock SCLK by a preset delay period. The preset delay period of the clock delay unit 127 may be set to generate the delay selection clock SCLKd after the bank fuse data BFD and the used fuse data UFD are generated in the fuse data generation circuit 115.

Figure 4:
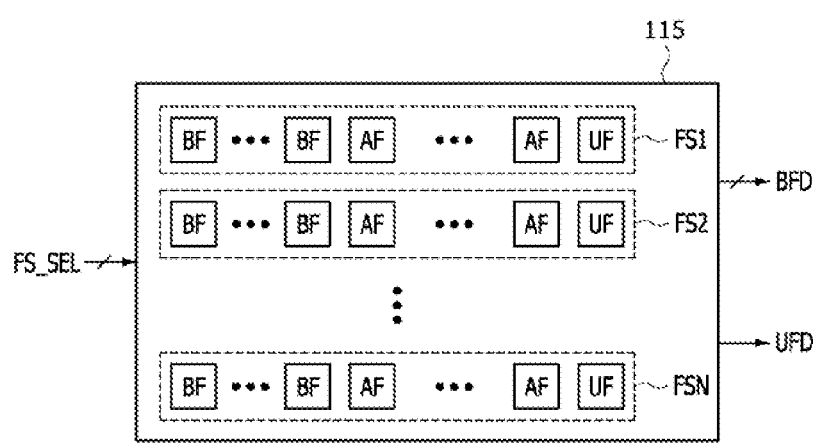
FIG. 4 is a block diagram illustrating a configuration according to an example of a fuse data generation circuit included in the semiconductor device illustrated in FIG. 2.

FIG. 4 is a block diagram illustrating a configuration according to an example of the fuse data generation circuit 115 included in the semiconductor device 13A illustrated in FIG. 2. As illustrated in FIG. 4, the fuse data generation circuit 115 may include first to Nth fuse sets FS1~FSN shared by a plurality of banks (not shown) for a repair operation. For example, the first to Nth fuse sets FS1~FSN may be shared by two banks for the repair operation. According to an embodiment, the first to Nth fuse sets FS1~FSN may be shared by three or more banks. The fuse data generation circuit 115 may sequentially select one of the first to Nth fuse set FS1~FSN based on the fuse set selection signal FS_SEL. For example, the fuse data generation circuit 115 may select the first fuse set FS1 when the fuse set selection signal FS_SEL has the first logic bit set and may select the Nth fuse set FSN when the fuse set selection signal FS_SEL has an Nth logic bit set. Here, 'N' may be set to a natural number of 2 or more. Each of the first to Nth fuse sets FS1~FSN may include a plurality of bank fuses BF, a plurality of address fuses AF, and a used fuse UF. The fuse data generation circuit 115 may generate the bank fuse data BFD and the used fuse data UFD from one fuse set selected from the first to Nth fuse sets FS1~FSN based on the fuse set selection signal FS_SEL. The fuse data generation circuit 115 may generate the bank fuse data BFD according to whether at least one of the bank fuses BF included in the fuse set selected based on the fuse set selection signal FS_SEL is cut. The bank fuse data BFD may include information on which bank the fuse set selected by the fuse set selection signal FS_SEL was used for the repair operation. For example, when the fuse set is used for the repair operation of the first bank (not shown), the bank fuse data BFD may be generated at a logic "low" level, and when the fuse set is used for the repair operation of the second bank (not shown), the bank fuse data BFD may be generated at a logic "high" level. The fuse data generation circuit 115 may generate the used fuse data UFD according to whether the used fuse UF included in the fuse set selected based on the fuse set selection signal FS_SEL is cut. The used fuse data UFD may include information on whether the fuse set selected by the fuse set selection signal FS_SEL is used in a repair operation for the banks sharing the fuse set. For example, when the selected fuse set is not used for the repair operation of the first bank (not shown) or the second bank (not shown), the used fuse data UFD may be generated at a logic "low" level, and when the selected fuse set is used for the repair operation of the first bank or the second bank, the used fuse data UFD may be generated at a logic "high" level. Each of the address fuses AF included in each of the first to Nth fuse sets FS1~FSN may store information on an address (hereinafter, referred to as a "failure cell address") for accessing the failed cell array. In this embodiment, although the first to Nth fuse sets FS1~FSN are set to be shared by a plurality of banks for the repair operation, the first to Nth fuse sets FS1 FSN may be set to be shared by cell arrays having various regions, according to an embodiment.

Figure 5:
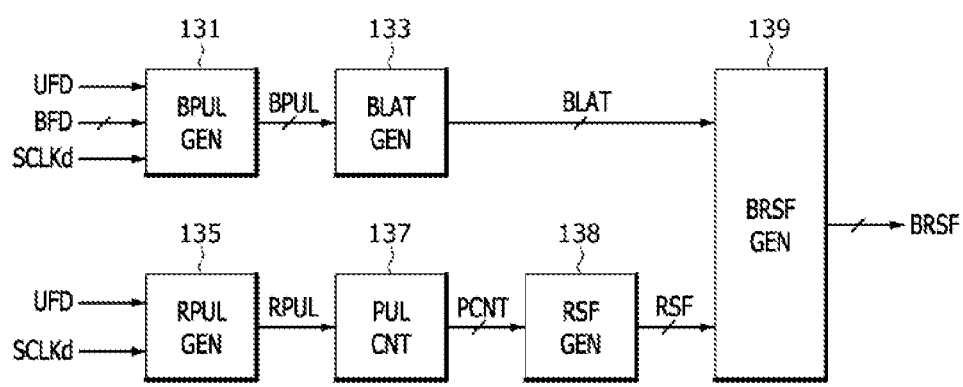
FIG. 5 is a block diagram illustrating a configuration according to an example of a flag generation circuit included in the semiconductor device illustrated in FIG. 2.

FIG. 5 is a block diagram illustrating a configuration according to an example of the flag generation circuit 117 included in the semiconductor device 13A illustrated in FIG. 2. As illustrated in FIG. 5, the flag generation circuit 117 may include a bank pulse generation circuit (BPUL) 131, a bank latch signal generation circuit (BLAT GEN) 133, a resource pulse generation circuit (RPUL GEN) 135, a pulse counter (PUL CNT) 137, a resource flag generation circuit (RSF GEN) 138, and a bank resource flag generation circuit (BRSF GEN) 139.

The bank pulse generation circuit 131 may receive the used fuse data UFD, the bank fuse data BFD, and the delay selection clock SCLKd to generate a bank pulse BPUL. The bank pulse generation circuit 131 may generate the bank pulse BPUL corresponding to the bank on which a repair operation is performed based on the used fuse data UFD and the bank fuse data BFD, from the delay selection clock SCLKd. For example, when a fuse set in which the used fuse data UFD and the bank fuse data BFD are generated is used in a repair operation for the first bank (not shown), the bank pulse generation circuit 131 may output the delay selection clock SCLKd as a first bit BPUL<1> of the bank pulse BPUL corresponding to the first bank. For another example, when the fuse set in which the used fuse data UFD and the bank fuse data BFD are generated is used in a repair operation for the second bank (not shown), the bank pulse generation circuit 131 may output the delay selection clock SCLKd as a second bit BPUL<2> of the bank pulse BPUL corresponding to the second bank. For another example, when the fuse set in which the used fuse data UFD and the bank fuse data BFD are generated is not used in the repair operation for the first bank or the second bank, the bank pulse generation circuit 131 may stop generating the bank pulse BPUL.

The bank latch signal generation circuit 133 may receive the bank pulse BPUL from the bank pulse generation circuit 131. The bank latch signal generation circuit 133 may generate a bank latch signal BLAT corresponding to the bank on which the repair operation is performed based on the bank pulse BPUL. For example, the bank latch signal generation circuit 133 may generate a first bit BLAT<1> of the bank latch signal BLAT set to have a logic "high" level when the fuse set is used in the repair operation for the first bank and the delay selection clock SCLKd is output as the first bit BPUL<1> of the bank pulse BPUL. For another example, the bank latch signal generation circuit 133 may generate a second bit BLAT<2> of the bank latch signal BLAT set to have a logic "high" level when the fuse set is used in the repair operation for the second bank and the delay selection clock SCLKd is output as the second bit BPUL<2> of the bank pulse BPUL.

The resource pulse generation circuit 135 may receive the used fuse data UFD and the delay selection clock SCLKd to generate a resource pulse RPUL. The resource pulse generation circuit 135 may output the delay selection clock SCLKd as the resource pulse RPUL when the fuse set in which the used fuse data UFD is generated is not used in the repair operation. For example, when the used fuse data UFD set to have a logic "low" level is generated because the fuse set is not used in the repair operation, the resource pulse generation circuit 135 may output the delay selection clock SCLKd as the resource pulse RPUL. For another example, when the used fuse data UFD set to have a logic "high" level is generated because the fuse set has been used in the repair operation, the resource pulse generation circuit 135 may stop generating the resource pulse RPUL.

The pulse counter 137 may receive the resource pulse RPUL from the resource pulse generation circuit 135. The pulse counter 137 may count the resource pulse RPUL to generate the pulse counting signal PCNT. For example, the pulse counter 137 may generate the pulse counting signal PCNT set to have a first logic bit set when the resource pulse RPUL occurs once because one of the fuse sets shared by the banks is not used in the repair operation. For another example, the pulse counter 137 may generate the pulse counting signal PCNT set to have a second logic bit set when the resource pulse RPUL occurs twice because two of the fuse sets shared by the banks are not used in the repair operation.

The resource flag generation circuit 138 may receive the pulse counting signal PCNT from the pulse counter 137. The resource flag generation circuit 138 may generate a resource flag RSF including information on the number of times it occurs that the fuse sets shared by the banks are not used in the repair operation based on the pulse counting signal PCNT. For example, when the pulse counting signal PCNT set to have a first logic bit set is generated because one of the fuse sets shared by the banks is not used in the repair operation, a first bit RSF<1> of the resource flag RSF may be set to have a logic "high" level. For another example, when the pulse counting signal PCNT set to have a second logic bit set is generated because two of the fuse sets shared by the banks are not used in the repair operation, a second bit RSF<2> of the resource flag RSF may be set to have a logic "high" level.

The bank resource flag generation circuit 139 may receive the bank latch signal BLAT from the bank latch signal generation circuit 133 and may receive the resource flag RSF from the resource flag generation circuit 138. The bank resource flag generation circuit 139 may generate a bank resource flag BRSF based on the bank latch signal BLAT and the resource flag RSF. For example, when the fuse sets shared by the first bank and the second bank are not used in the repair operations for the first bank and the second bank, the bank resource flag generation circuit 139 may generate the bank resource flag BRSF whose logic bit set is set so that repair operations for the first bank and the second bank can be performed. For another example, when the fuse sets shared by the first bank and the second bank have been used in the repair operation for the first bank and only one unused fuse set remains, the bank resource flag generation circuit 139 may generate the bank resource flag BRSF whose logic bit set is set so that the repair operation for the second bank can be performed. For another example, when the fuse sets shared by the first bank and the second bank have been used in the repair operation for the first bank and at least two unused fuse sets remain, the bank resource flag generation circuit 139 may generate the bank resource flag BRSF whose logic bit set is set so that repair operations for the first bank and the second bank can be performed. For another example, when the fuse sets shared by the first bank and the second bank have been used in the repair operation for the second bank and only one unused fuse set remains, the bank resource flag generation circuit 139 may generate the bank resource flag BRSF whose logic bit set is set so that the repair operation for the first bank can be performed. For another example, when the fuse sets shared by the first bank and the second bank are used in the repair operation for the second bank and at least two unused fuse sets remain, the bank resource flag generation circuit 139 may generate the bank resource flag BRSF whose logic bit set is set so that the repair operations for the first bank and the second bank can be performed. For another example, when no unused fuse set remains in the fuse sets shared by the first bank and the second bank, the bank resource flag generation circuit 139 may generate the bank resource flag BRSF whose logic bit set is set so that the repair operations for the first bank and the second bank are not performed.

Figure 6:
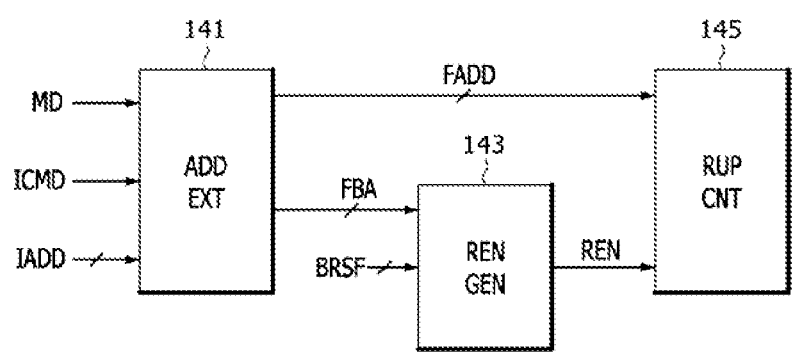
FIG. 6 is a block diagram illustrating a configuration according to an example of a repair control circuit included in the semiconductor device illustrated in FIG. 2.

FIG. 6 is a block diagram illustrating a configuration according to an example of the repair control circuit 119 included in the semiconductor device 13A illustrated in FIG. 2. As illustrated in FIG. 6, the repair control circuit 119 may include an address extraction circuit (ADD EXT) 141, a rupture enable signal generation circuit (REN GEN) 143, and a rupture control circuit (RUP CNT) 145.

The address extraction circuit 141 may generate a failure bank address FBA and a failure address FADD based on the mode signal MD, the internal command ICMD, and the internal address IADD. The address extraction circuit 141 may extract the failure bank address FBA and the failure address FADD from the internal address IADD when the internal command ICMD for an active operation is generated while the mode signal MD is activated for the repair operation. The failure bank address FBA is generated to select a bank on which a repair operation is to be performed, and the failure address FADD is generated to access a failed cell array included in the bank on which the repair operation is to be performed.

The rupture enable signal generation circuit 143 may receive the failure bank address FBA from the address extraction circuit 141. The rupture enable signal generation circuit 143 may determine whether repair is possible for a bank to be repaired based on the failure bank address FBA and the bank resource flag BRSF to generate a rupture enable signal REN. The rupture enable signal REN may be enabled when repair is possible for the bank on which repair is to be performed. For example, the rupture enable signal generation circuit 143 may determine whether a repair operation on the first bank is possible according to the bank resource flag BRSF to generate the rupture enable signal REN for the repair operation for the first bank when the repair operation on the first bank (not shown) is to be performed according to the failure bank address FBA.

The rupture control circuit 145 may receive the failure address FADD from the address extraction circuit 141 and may receive the rupture enable signal REN from the rupture enable signal generation circuit 143. The rupture control circuit 145 may perform a rupture operation of storing the failure address FADD in the fuse set when the rupture enable signal REN, which is enabled by determining that the repair operation is possible for the bank to be repaired, is generated. The repair operation performed according to the present embodiment may be implemented as hard-PPR or soft-PPR included in post package repair (PPR).

Figure 7:
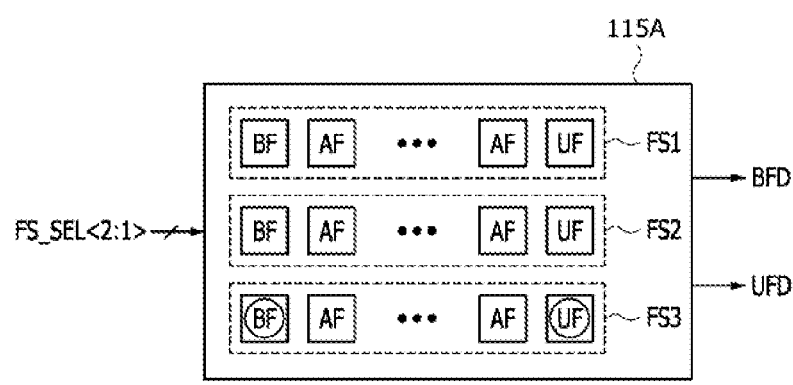
FIG. 7 is a diagram illustrating a configuration according to another example of the fuse data generation circuit included in the semiconductor device illustrated in FIG. 2.

FIG. 7 is a diagram illustrating a configuration of a fuse data generation circuit 115A according to another example of the fuse data generation circuit 115 included in the semiconductor device 13A illustrated in FIG. 2. As illustrated in FIG. 7, the fuse data generation circuit 115A may include first to third fuse sets FS1~FS3 shared by a first bank (not shown) and a second bank (not shown) for a repair operation. The fuse data generation circuit 115A may sequentially select one of the first to third fuse sets FS1~FS3 based on the fuse set selection signal FS_SEL<2:1>. For example, the fuse data generation circuit 115A may select the first fuse set FS1 when the fuse set selection signal FS_SEL<2:1> having a first logic bit set is received, may select the second fuse set FS2 when the fuse set selection signal FS_SEL<2:1> having a second logic bit set is received, and may select the third fuse set FS3 when the fuse set selection signal FS_SEL<2:1> having a third logic bit set is received. The first fuse set FS1 may include a bank fuse BF, a plurality of address fuses AF, and a used fuse UF. The fuse data generation circuit 115A may generate the bank fuse data BFD and the used fuse data UFD each having a logic level determined according to whether each of the bank fuse BF and the used fuse UF included in the first fuse set FS1 is cut, when the first fuse set FS1 is selected based on the fuse set selection signal FS_SEL<2:1>. When the first fuse set FS1 is selected, the fuse data generation circuit 115A may generate the bank fuse data BFD of a logic "low" level based on an uncut bank fuse BF and may generate the used fuse data UFD of a logic "low" level based on an uncut used fuse UF. By the used fuse data UFD of the logic "low" level generated by the fuse data generation circuit 115A, it may be confirmed that the first fuse set FS1 is not used in the repair operations of the first bank and the second bank. The second fuse set FS2 may include a bank fuse BF, a plurality of address fuses AF, and a used fuse UF. The fuse data generation circuit 115A may generate the bank fuse data BFD and the used fuse data UFD each having a logic level determined according to whether each of the bank fuse BF and the used fuse UF included in the second fuse set FS2 is cut, when the second fuse set FS2 is selected based on the fuse set selection signal FS_SEL<2:1>. When the second fuse set FS2 is selected, the fuse data generation circuit 115A may generate the bank fuse data BFD of a logic "low" level based on the uncut bank fuse BF and may generate the used fuse data UFD of a logic "low" level based on the uncut used fuse UF. By the used fuse data UFD of the logic "low" level generated by the fuse data generation circuit 115A, it may be confirmed that the second fuse set FS2 is not used in the repair operations of the first bank and the second bank. The third fuse set FS3 may include a bank fuse BF, a plurality of address fuses AF, and a used fuse UF. The fuse data generation circuit 115A may generate the bank fuse data BFD and the used fuse data UFD each having a logic level determined according to whether each of the bank fuse BF and the used fuse UF included in the third fuse set FS3 is cut, when the third fuse set FS3 is selected based on the fuse set selection signal FS_SEL<2:1>. When the third fuse set FS3 is selected, the fuse data generation circuit 115A may generate the bank fuse data BFD of a logic "high" level based on the cut bank fuse BF and may generate the used fuse data UFD of a logic "high" level based on the cut used fuse UF. In the figures, cut fuses are indicated with a circle. By the bank fuse data BFD of the logic "high" level and the used fuse data UFD of the logic "high" level generated by the fuse data generation circuit 115A, it may be confirmed that the third fuse set FS3 has been used for the repair operation of the second bank.

FIGS. 8 and 9 are diagrams illustrating an operation of the semiconductor device 13A including the fuse data generation circuit 115A illustrated in FIG. 7.

As illustrated in FIG. 8, when the fuse set selection signal FS_SEL<2:1> has a first logic bit set '01', the first fuse set FS1 may be selected. When the fuse set selection signal FS_SEL<2:1> has the first logic bit set '01', it may mean that a second bit FS_SEL<2> of the fuse set selection signal has a logic "low" level and a first bit FS_SEL<1> of the fuse set selection signal has a logic "high" level. Because the bank fuse BF included in the first fuse set FS1 shown in FIG. 7 is not cut, the bank fuse data BFD may be generated at a logic "low" level, and because the used fuse UF included in the first fuse set FS1 is not cut, the used fuse data UFD may be generated at a logic "low" level.

As illustrated in FIG. 9, when the bank fuse data BFD is generated at a logic "low" level, a first bit BLAT<1> of the bank latch signal BLAT corresponding to the first bank (not shown) may be generated at a logic "high" level, and a second bit BLAT<2> of the bank latch signal BLAT corresponding to the second bank (not shown) may be generated at a logic "low" level. When the used fuse data UFD is generated at a logic "low" level for the first time, a first bit RSF<1> of the resource flag RSF may be generated at a logic "high" level, and a second bit RSF<2> of the resource flag RSF may be generated at a logic "low" level.

As illustrated in FIG. 8, when the fuse selection signal FS_SEL<2:1> has a second logic bit set '10', the second fuse set FS2 may be selected. When the fuse set selection signal FS_SEL<2:1> has the logic bit set '10', it may mean that the second bit FS_SEL<2> of the fuse set selection signal has a logic "high" level and the first bit FS_SEL<1> of the fuse set selection signal has a logic "low" level. Because the bank fuse BF included in the second fuse set FS2 shown in FIG. 7 is not cut, the bank fuse data BFD may be generated at a logic "low" level, and because the used fuse UF included in the second fuse set FS2 is not cut, the used fuse data UFD may be generated at a logic "low" level.

As illustrated in FIG. 9, when the bank fuse data BFD is generated at a logic "low" level, the first bit BLAT<1> of the bank latch signal BLAT corresponding to the first bank (not shown) may maintain the logic "high" level, and the second bit BLAT<2> of the bank latch signal BLAT corresponding to the second bank (not shown) may maintain the logic "low" level. When the used fuse data UFD is generated at a logic "low" level for the second time, both the first bit RSF<1> of the resource flag RSF and the second bit RSF<2> of the resource flag RSF may be generated at a logic "high" level.

As illustrated in FIG. 8, when the fuse selection signal FS_SEL<2:1> has a third logic bit set '11', the third fuse set FS3 may be selected. When the fuse set selection signal FS_SEL<2:1> has the third logic bit set '11', it may mean that the second bit FS_SEL<2> of the fuse set selection signal has a logic "high" level and the first bit FS_SEL<1> of the fuse set selection signal has a logic "high" level. Because the bank fuse BF included in the third fuse set FS3 shown in FIG. 7 is cut, the bank fuse data BFD may be generated at a logic "high" level, and because the used fuse UF included in the third fuse set FS3 is cut, the used fuse data UFD may be generated at a logic "high" level.

As illustrated in FIG. 9, when the bank fuse data BFD is generated at a logic "high" level, the first bit BLAT<1> of the bank latch signal BLAT corresponding to the first bank (not shown) may maintain the logic "high" level, and the second bit BLAT<2> of the bank latch signal BLAT corresponding to the second bank (not shown) may be generated at a logic "high" level. When the used fuse data UFD is generated at the logic "high" level, the first bit RSF<1> of the resource flag RSF and the second bit RSF<2> of the resource flag RSF may maintain the previously set logic levels.

Figure 10:
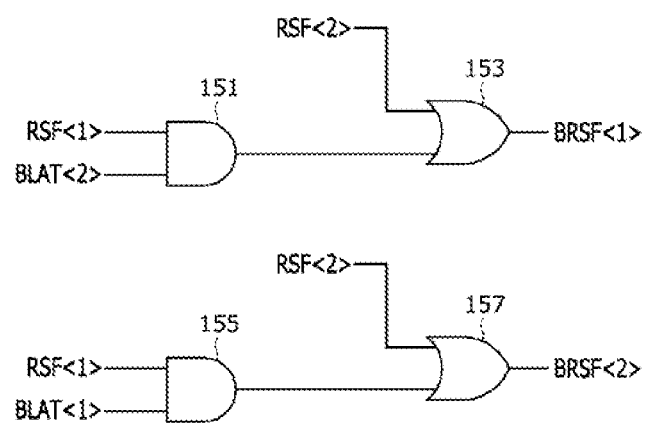
FIG. 10 is a circuit diagram according to an example of a bank resource flag generation circuit included in the flag generation circuit illustrated in FIG. 5.

FIG. 10 is a circuit diagram according to an example of the bank resource flag generation circuit 139 included in the flag generation circuit 117 illustrated in FIG. 5. As illustrated in FIG. 10, the bank resource flag generation circuit 139 may include AND gates 151 and 155, and OR gates 153 and 157. The AND gate 151 may receive the first bit RSF<1> of the resource flag RSF and the second bit BLAT<2> of the bank latch signal BLAT to perform a logical AND operation on the first bit RSF<1> of the resource flag RSF and the second bit BLAT<2> of the bank latch signal BLAT. The OR gate 153 may receive the second bit RSF<2> of the resource flag RSF and an output signal of the AND gate 151 and perform a logical OR operation on the second bit RSF<2> of the resource flag RSF and the output signal of the AND gate 151 to generate a first bit BRSF<1> of the bank resource flag BRSF. The AND gate 155 may receive the first bit RSF<1> of the resource flag RSF and the first bit BLAT<1> of the bank latch signal BLAT to perform a logical AND operation on the first bit RSF<1> of the resource flag RSF and the first bit BLAT<1> of the bank latch signal BLAT. The OR gate 157 may receive the second bit RSF<2> of the resource flag RSF and an output signal of the AND gate 155 and perform a logical OR operation on the second bit RSFF<2> of the resource flag RSF and the output signal of the AND gate 155 to generate a second bit BRSF<2> of the bank resource flag BRSF.

FIG. 11 is a table illustrating an operation of the bank resource flag generation circuit 139 illustrated in FIG. 10.

As illustrated in the first row of FIG. 11, the bank resource flag generation circuit 139 may generate the first bit BRSF<1> of the bank resource flag BRSF and the second bit BRSF<2> of the bank resource flag BRSF, which are all set to have a logic "high" level by the second bit RSF<2> of the resource flag RSF set to have a logic "high" level when at least two unused fuse sets are included in the repair operations of the first bank (not shown) and the second bank (not shown) among the sequentially selected fuse sets. The unused fuse sets may be used for a repair operation of the first bank or the second bank by the first bit BRSF<1> of the bank resource flag BRSF and the second bit BRSF<2> of the bank resource flag BRSF, which are all set to the logic "high" level.

As illustrated in the second row of FIG. 11, the bank resource flag generation circuit 139 may generate the second bit RSF<2> of the resource flag RSF set to have a logic "low" level and the first bit RSF<1> of the resource flag RSF set to have a logic "high" level when one unused fuse set is included in the repair operation of the first bank and the second bank among the fuse sets that are sequentially selected, and may generate the second bit BLAT<2> of the bank latch signal BLAT set to have a logic "high" level when it is confirmed that the repair operation on the second bank has been performed. The first bit BRSF<1> of the bank resource flag BRSF set to have a logic "high" level and the second bit BRSF<2> of the bank resource flag BRSF set to have a logic "low" level are generated by the first bit RSF<1> of the resource flag RSF set to have a logic "high" level and the second bit BLAT<2> of the bank latch signal BLAT set to have a logic "high" level. The unused fuse set may be used in the repair operation of the first bank for which a repair operation has not been performed by the first bit BRSF<1> of the bank resource flag BRSF set to have a logic "high" level.

As illustrated in the second row of FIG. 11, the bank resource flag generation circuit 139 may generate the second bit RSF<2> of the resource flag RSF set to have a logic "low" level and the first bit RSF<1> of the resource flag RSF set to have a logic "high" level when one unused fuse set is included in the repair operation of the first bank and the second bank among the fuse sets that are sequentially selected, and may generate the second bit BLAT<2> of the bank latch signal BLAT set to have a logic "high" level and the first bit BLAT<1> of the bank latch signal BLAT set to have a logic "low" level when it is confirmed that the repair operation on the second bank has been performed. The first bit BRSF<1> of the bank resource flag BRSF set to have a logic "high" level and the second bit BRSF<2> of the bank resource flag BRSF set to have a logic "low" level are generated by the first bit RSF<1> of the resource flag RSF set to have a logic "high" level, the second bit BLAT<2> of the bank latch signal BLAT set to have a logic "high" level, the first bit BLAT<1> of the bank latch signal BLAT set to have a logic "low" level and the second bit RSF<2> of the resource flag RSF set to have a logic "low" level. The unused fuse set may be used in the repair operation of the first bank for which a repair operation has not been performed by the first bit BRSF<1> of the bank resource flag BRSF set to have a logic "high" level.

As illustrated in the third row of FIG. 11, when one fuse set unused in the repair operation of the first bank and the second bank is included among the sequentially selected fuse sets, the bank resource flag generation circuit 139 may generate the second bit RSF<2> of the resource flag RSF set to have a logic "low" level and the first bit RSF<1> of the resource flag RSF set to have a logic "high" level, and may generate the first bit BLAT<1> of the bank latch signal BLAT set to have a logic "high" level and a second bit BLAT<2> of the bank latch signal BLAT set to have a logic "low" level when it is confirmed that the repair operation for the first bank and the second bank has been performed. The first bit BRSF<1> of the bank resource flag BRSF set to have a logic "low" level and the second bit BRSF<2> of the bank resource flag BRSF set to have a logic "high" level may be generated by the first bit RSF<1> of the resource flag RSF set to have a logic "high" level, the first bit BLAT<1> of the bank latch signal BLAT set to have a logic "high" level, the second bit BLAT<2> of the bank latch signal BLAT set to have a logic "low" level and the second bit RSF<2> of the resource flag RSF set to have a logic "low" level. The unused fuse set may be used for the repair operation of the second bank for which a repair operation has not been performed by the second bit BRSF<2> of the bank resource flag BRSF set to have a logic "high" level As illustrated in the fourth row of FIG. 11, when one fuse set that is not used in the repair operation of the first bank and the second bank is included among the sequentially selected fuse sets, the bank resource flag generation circuit 139 may generate the second bit RSF<2> of the resource flag RSF set to have a logic "low" level and the first bit RSF<1> of the resource flag RSF set to have a logic "high" level, and may generate the first bit BLAT<1> of the bank latch signal BLAT and the second bit BLAT<2> of the bank latch signal BLAT both set to a logic "high" when it is confirmed that the repair operation for the first bank and the second bank has been performed. The first bit BRSF<1> of the bank resource flag BRSF and the second bit BRSF<2> of the bank resource flag BRSF both set to have a logic "high" level may be generated by the first bit RSF<1> of the resource flag RSF set to have a logic "high" level, the first bit BLAT<1> of the bank latch signal BLAT and the second bit BLAT<2> of the bank latch signal BLAT both set to have a logic "high". The unused fuse set may be used in a repair operation of the first bank or the second bank by the first bit BRSF<1> of the bank resource flag BRSF and the second bit BRSF<2> of the bank resource flag BRSF both set to have a logic "high" level.

As illustrated in the fifth row of FIG. 11, when there is no fuse set unused in the repair operation of the first bank and the second bank among the sequentially selected fuse sets, the bank resource flag generation circuit 139 may generate the second bit RSF<2> of the resource flag RSF and the first bit RSF<1> of the resource flag RSF all set to have a logic "low" level. Because there is no unused fuse set to be used for the repair operation, the repair operation of the first bank or the second bank is not performed.

Figure 12:
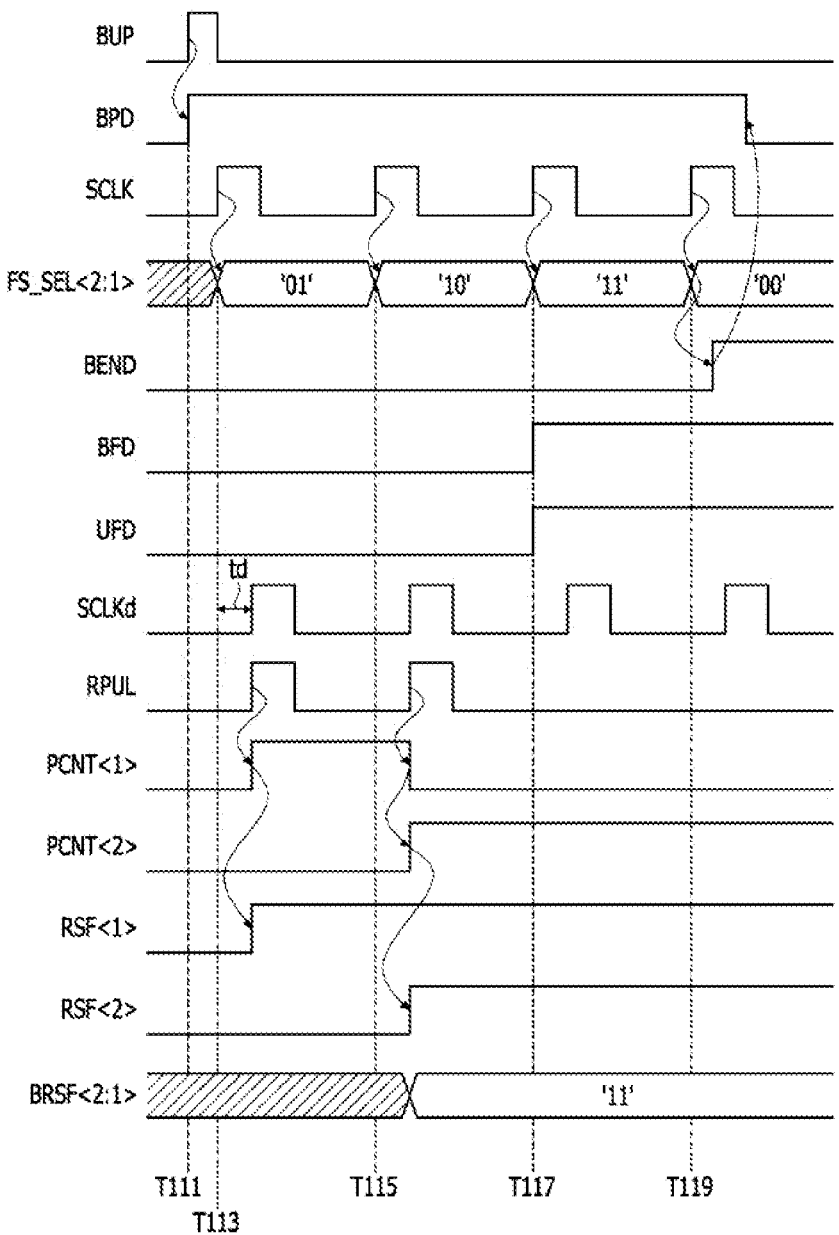
FIG. 12 is a timing diagram illustrating an operation of the semiconductor device including the fuse data generation circuit illustrated in FIG. 7 and the bank resource flag generation circuit illustrated in FIG. 10.

FIG. 12 is a timing diagram illustrating an operation of the semiconductor device 13A including the fuse data generation circuit 115A illustrated in FIG. 7 and the bank resource flag generation circuit 139 illustrated in FIG. 10.

Referring to FIG. 12, when the boot-up pulse BUP is generated for a boot-up operation at a point in time T111, the boot-up period signal BPD may be enabled at a logic "high" level so that the boot-up operation may be performed, and the selection clock SCLK may be generated during the time when the boot-up operation is performed. A logic bit set of the fuse selection signal FS_SEL<2:1> may be sequentially changed in synchronization with a rising edge of the selection clock SCLK. More specifically, at a point in time T113, the fuse selection signal FS_SEL<2:1> may be set to have a first logic bit set '01' in synchronization with a first rising edge of the selection clock SCLK, at a point in time T115, the fuse selection signal FS_SEL<2:1> may be set to have a second logic bit set '10' in synchronization with a second rising edge of the selection clock SCLK, at a point in time T117, the fuse selection signal FS_SEL<2:1> may be set to have a third logic bit set '11' in synchronization with a third rising edge of the selection clock SCLK, and at a point in time T119, the fuse selection signal FFS_SEL<2:1> may be set to have a fourth logic bit set '00' in synchronization with a fourth rising edge of the selection clock SCLK.

As illustrated in FIGS. 7 and 12, during the period from the point in time T113 to the point in time T115, the fuse data generation circuit 115A may receive the fuse selection signal FS_SEL<2:1> set to have the first logic bit set '01' to select the first fuse set FS1, and may generate the bank fuse data BFD and the used fuse data UFD both set to have a logic "low" level according to both uncut bank fuse BF and used fuse UF. During the period from the point in time T115 to the point in time T117, the fuse data generation circuit 115A may receive the fuse selection signal FS_SEL<2:1> set to have the second logic bit set '10' to select the second fuse set FS2, and may generate the bank fuse data BFD and the used fuse data UFD both set to have a logic "low" level according to both uncut bank fuse BF and used fuse UF. During the period from the point in time T117 to the point in time T119, the fuse data generation circuit 115A may receive the fuse selection signal FS_SEL<2:1> set to have the third logic bit set '11' to select the third fuse set FS3, and may generate the bank fuse data BFD and the used fuse data UFD both set to have a logic "high" level according to both cut bank fuse BF and used fuse UF. After the point in time T119, when a boot-up end signal BEND is activated according to the fuse selection signal FS_SEL set to have the fourth logic bit set '00', the boot-up period signal BPD may be disabled at a logic "low" level to end the boot-up operation.

As illustrated in FIG. 12, during the period from the point in time T113 to the point in time T117, the used fuse data UFD maintains a logic "low" level, so that the delay selection clock SCLKd generated by delaying the selection clock SCLK by a delay period may be output as a resource pulse RPUL. In synchronization with a first rising edge of the resource pulse RPUL, the first bit PCNT<1> of the pulse counting signal PCNT may transition from a logic "low" level to a logic "high" level. In synchronization with a rising edge of the first bit PCNT<1> of the pulse counting signal PCNT, the first bit RSF<1> of the resource flag RSF may transition from a logic "low" level to a logic "high" level. In synchronization with a second rising edge of the resource pulse RPUL, the first bit PCNT<1> of the pulse counting signal PCNT may transition from a logic "high" level to a logic "low" level and the second bit PCNT<2> of the pulse counting signal PCNT may transition from a logic "low" level to a logic "high" level. In synchronization with the rising edge of the second bit PCNT<2> of the pulse counting signal PCNT, the second bit RSF<2> of the resource flag RSF may transition from a logic "low" level to a logic "high" level.

As illustrated in FIG. 12, after the point in time T117, the used fuse data UFD is generated at a logic "high" level, but the second bit RSF<2> of the resource flag RSF maintains the logic "high" level, so that the logic bit set of the bank resource flag BRSF<2:1> generated by the bank resource flag generation circuit 139 illustrated in FIG. 10 may be set to '11'. When the logic bit set of the bank resource flag BRSF<2:1> is '11', it may mean that the second bit BRSF<2> of the bank resource flag BRSF has a logic "high" level and the first bit BRSF<1> of the bank resource flag BRSF has a logic "high" level. When a repair operation is performed after the boot-up operation is completed, the logic bit set of the bank resource flag BRSF<2:1> is set to '11', so that the repair operation may be performed on the first bank (not shown) and the second bank (not shown). More specifically, in the case of the fuse data generation circuit 115A illustrated in FIG. 7, because the first fuse set FS1 and the second fuse set FS2 are not used, it may be confirmed in the boot-up operation that the repair operation for the first bank and the second bank may be performed using the unused first fuse set FS1 and the second fuse set FS2.

Figure 13:
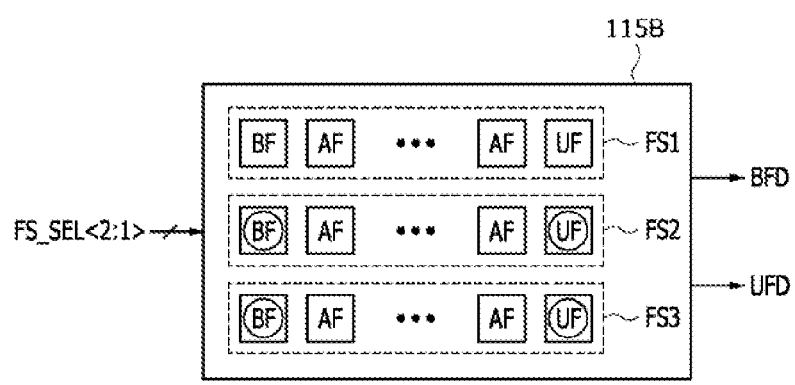
FIG. 13 is a diagram illustrating a configuration according to another example of the fuse data generation circuit included in the semiconductor device illustrated in FIG. 2.

FIG. 13 is a diagram illustrating a configuration of a fuse data generation circuit 115B according to another example of the fuse data generation circuit 115 included in the semiconductor device 13A illustrated in FIG. 2. As illustrated in FIG. 13, the fuse data generation circuit 115B may include first to third fuse sets FS1~FS3 shared by a first bank (not shown) and a second bank (not shown) for a repair operation. The fuse data generation circuit 115B may sequentially select one of the first to third fuse sets FS1~FS3 based on a fuse set selection signal FS_SEL<2:1>. When the first fuse set FS1 is selected based on the fuse set selection signal FS_SEL<2:1>, the fuse data generation circuit 115B may generate a bank fuse data BFD of a logic "low" level based on an uncut bank fuse BF and may generate a used fuse data UFD of a logic "low" level based on the uncut used fuse UF. When the second fuse set FS2 is selected based on the fuse set selection signal FS_SEL<2:1>, the fuse data generation circuit 115B may generate the bank fuse data BFD of a logic "high" level based on the cut bank fuse BF and generate the used fuse data UFD of a logic "high" level based on the cut used fuse UF. When the third fuse set FS3 is selected based on the fuse set selection signal FS_SEL<2:1>, the fuse data generation circuit 115B may generate the bank fuse data BFD of a logic "high" level based on the cut bank fuse BF and may generate the used fuse data UFD of a logic "high" level based on the cut used fuse UF.

Figure 14:
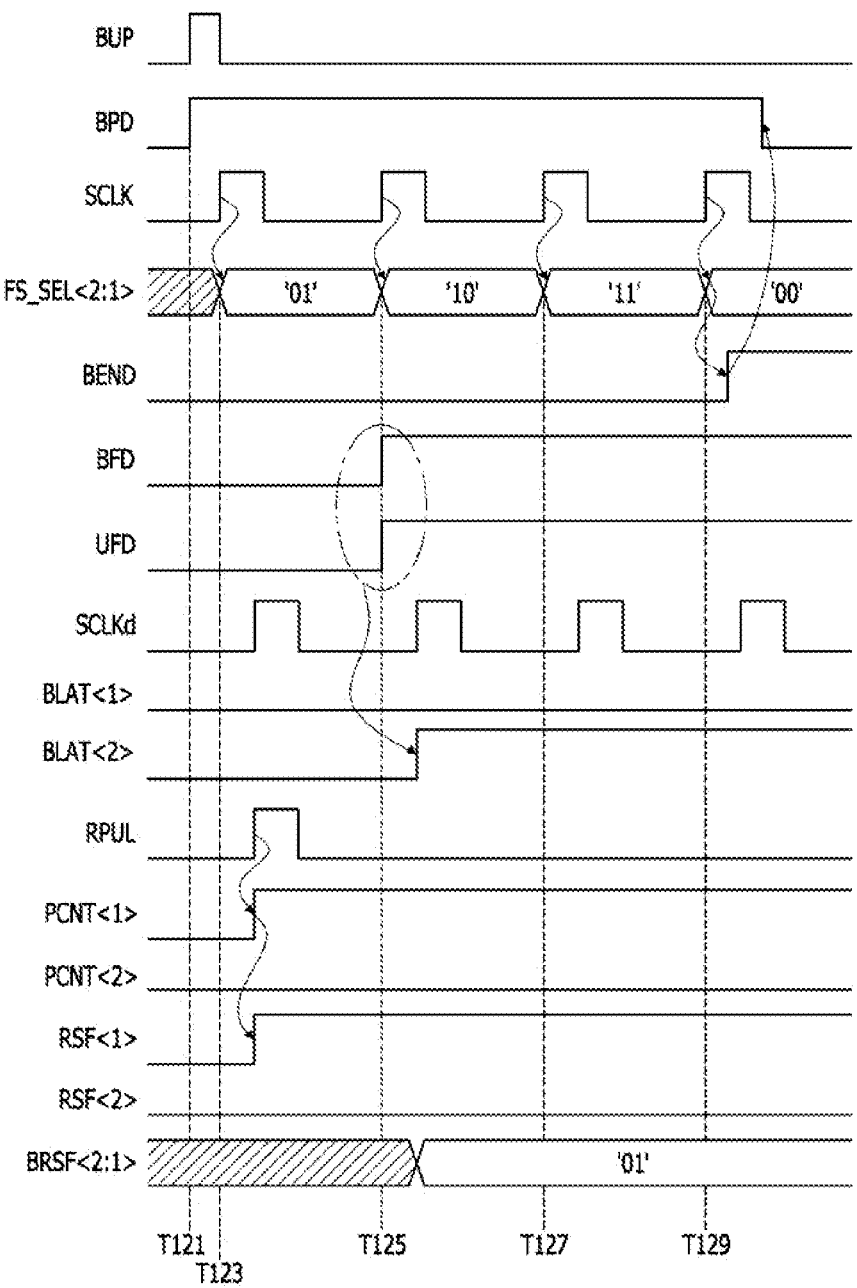
FIG. 14 is a timing diagram illustrating an operation of the semiconductor device including the fuse data generation circuit illustrated in FIG. 13.

FIG. 14 is a timing diagram illustrating an operation of the semiconductor device 13A including the fuse data generation circuit 115B illustrated in FIG. 13.

Referring to FIGS. 13 and 14, when the boot-up pulse BUP is generated for a boot-up operation at a point in time T121, the boot-up period signal BPD is enabled at a logic "high" level to perform the boot-up operation, and the selection clock SCLK may be generated when the boot-up operation is performed. A logic bit set of the fuse selection signal FS_SEL<2:1> may be sequentially changed in synchronization with a rising edge of the selection clock SCLK. During a period from a point in time T123 to a point in time T125, the fuse data generation circuit 115B may receive the fuse selection signal FS_SEL<2:1> set to have a first logic bit set '01' to select the first fuse set FS1 and may generate the bank fuse data BFD and the used fuse data UFD both set to have a logic "low" level according to both uncut bank fuse BF and used fuse UF. During a period from the point in time T125 to a point in time T127, the fuse data generation circuit 115B may receive the fuse selection signal FS_SEL<2:1> set to have a second logic bit set '10' to select the second fuse set FS2 and may generate the bank fuse data BFD and the used fuse data UFD both set to a logic "high" level according to both cut bank fuse BF and used fuse UF. During a period from the point in time T127 to a point in time T129, the fuse data generation circuit 115B may receive the fuse selection signal FS_SEL<2:1> set to have a third logic bit set '11' to select the third fuse set FS3 and may generate the bank fuse data BFD and the used fuse data UFD both set to a logic "high" level according to both cut bank fuse BF and used fuse UF. After the point in time T129, when the boot-up end signal BEND is activated according to the fuse selection signal FS_SEL<2:1> set to have a fourth logic bit set '00', the boot-up period signal BPD may be disabled at a logic "low" level to end the boot-up operation.

As illustrated in FIG. 14, during the period from the point in time T123 to the point in time T125, the used fuse data UFD maintains a logic "low" level, so that the delay selection clock SCLKd generated by delaying the selection clock SCLK by a delay period may be output as a resource pulse RPUL. In synchronization with a first rising edge of the resource pulse RPUL, a first bit PCNT<1> of a pulse counting signal PCNT may transition from a logic "low" level to a logic "high" level. In synchronization with the rising edge of the first bit PCNT<1> of the pulse counting signal PCNT, the first bit RSF<1> of the resource flag RSF transitions from a logic "low" level to a logic "high" level.

As illustrated in FIG. 14, after the point in time T125, both the used fuse data UFD and the bank fuse data BFD are generated at a logic "high" level, so that the second bit BLAT<2> of the bank latch signal BLAT may transition from a logic "low" level to a logic "high" level. When the second bit BLAT<2> of the bank latch signal BLAT is set to have a logic "high" level while the first bit RSF<1> of the resource flag RSF is set to have a logic "high" level, a logic bit set of the bank resource flag BRSF<2:1> may be set to '01'. When the logic bit set of the bank resource flag BRSF<2:1> is '01', it may mean that the second bit BRSF<2> of the bank resource flag BRSF has a logic "low" level and the first bit BRSF<1> of the bank resource flag BRSF has a logic "high" level. When the repair operation is performed after the boot-up operation is completed, the logic bit set of the bank resource flag BRSF<2:1> is set to '01', so that the repair operation for the first bank (not shown) may be performed. More specifically, in the case of the fuse data generation circuit 115B shown in FIG. 13, because the first fuse set FS1 is unused, it may be confirmed in the boot-up operation that the repair operation for the first bank may be performed using the unused first fuse set FS1.

Figure 15:
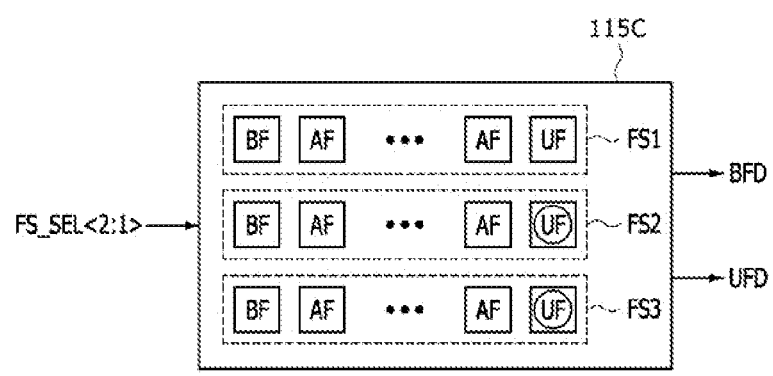
FIG. 15 is a diagram illustrating a configuration according to another example of the fuse data generation circuit included in the semiconductor device illustrated in FIG. 2.

FIG. 15 is a diagram illustrating a configuration of a fuse data generation circuit 115C according to another example of the fuse data generation circuit 115 included in the semiconductor device 13A illustrated in FIG. 2. As illustrated in FIG. 15, the fuse data generation circuit 115C may include first to third fuse sets FS1~FS3 shared by a first bank (not shown) and a second bank (not shown) for a repair operation. The fuse data generation circuit 115C may sequentially select one of the first to third fuse sets FS1~FS3 based on a fuse set selection signal FS_SEL<2:1>. When the first fuse set FS1 is selected based on the fuse set selection signal FS_SEL<2:1>, the fuse data generation circuit 115C may generate a bank fuse data BFD of a logic "low" level based on an uncut bank fuse BF and may generate a used fuse data UFD of a logic "low" level based on an uncut used fuse UF. When the second fuse set FS2 is selected based on the fuse set selection signal FS_SEL<2:1>, the fuse data generation circuit 115C may generate the bank fuse data BFD of a logic "low" level based on the uncut bank fuse BF and may generate the used fuse data UFD of a logic "high" level based on the cut used fuse UF. When the third fuse set FS3 is selected based on the fuse set selection signal FS_SEL<2:1>, the fuse data generation circuit 115C may generate the bank fuse data BFD of a logic "low" level based on the uncut bank fuse BF and may generate the used fuse data UFD of a logic "high" level based on the cut used fuse UF.

Figure 16:
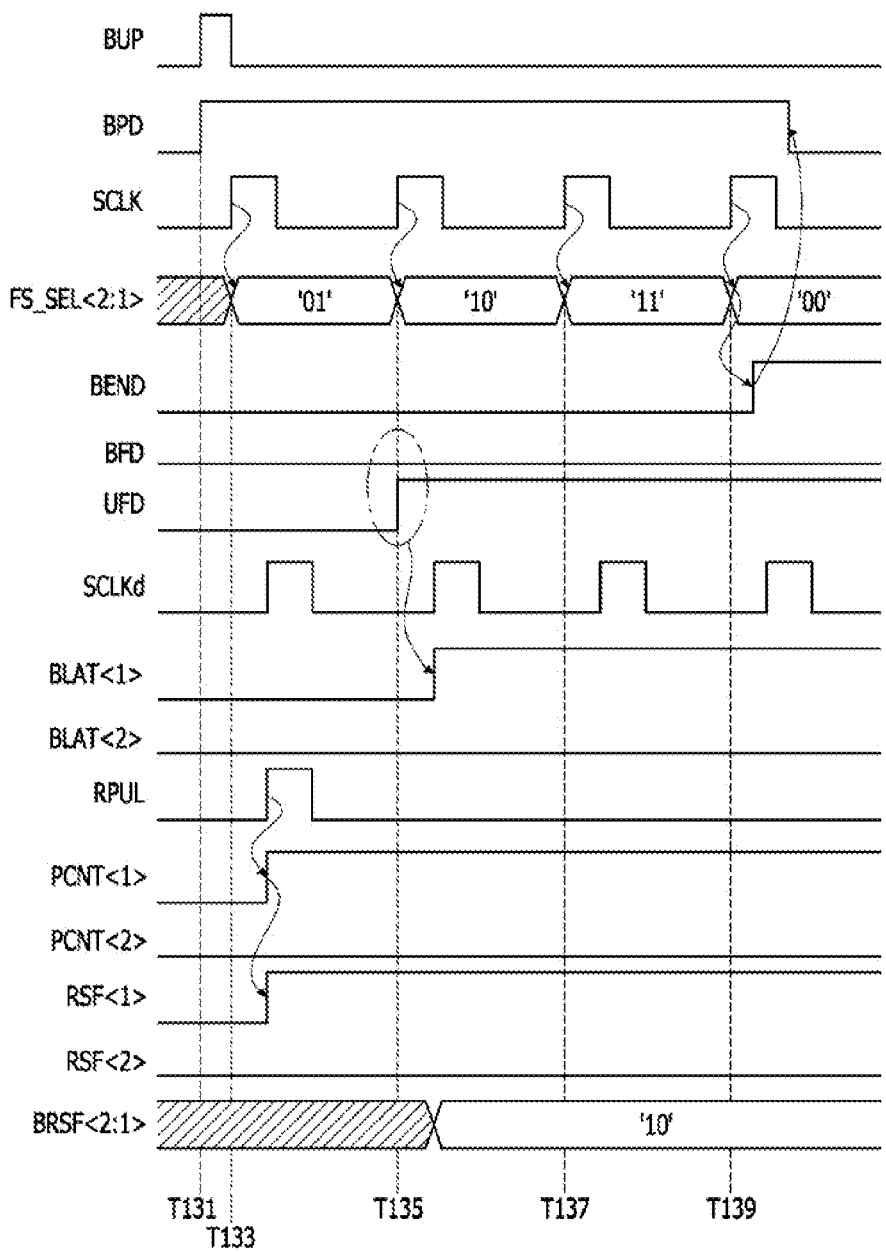
FIG. 16 is a timing diagram illustrating an operation of the semiconductor device including the fuse data generation circuit illustrated in FIG. 15.

FIG. 16 is a timing diagram illustrating an operation of the semiconductor device 13A including the fuse data generation circuit 115C illustrated in FIG. 15.

Referring to FIGS. 15 and 16, when the boot-up pulse BUP is generated for a boot-up operation at a point in time T131, the boot-up period signal BPD may be enabled at a logic "high" level, so that the boot-up operation may be performed, and the selection clock SCLK may be generated when the boot-up operation is performed. A logic bit set of the fuse selection signal FS_SEL<2:1> may be sequentially changed in synchronization with a rising edge of a selection clock SCLK. During a period from a point in time T133 to a point in time T135, the fuse data generation circuit 115C may receive the fuse selection signal FS_SEL<2:1> set to have a first logic bit set '01' to select the first fuse set FS1 and may generate the bank fuse data BFD and the used fuse data UFD both set to have a logic "low" level according to both uncut bank fuse BF and used fuse UF. During a period from the point in time T135 to a point in time T137, the fuse data generation circuit 115C may receive the fuse selection signal FS_SEL<2:1> set to have a second logic bit set '10' to select the second fuse set FS2, may generate the bank fuse data BFD set to a logic "low" level according to the uncut bank fuse BF and may generate the used fuse data UFD set to a logic "high" level according to the cut used fuse UF. During a period from the point in time T137 to a point in time T139, the fuse data generation circuit 115C may receive the fuse selection signal FS_SEL<2:1> set to have a third logic bit set '11' to select the third fuse set FS3, may generate the bank fuse data BFD set to a logic "low" level according to the uncut bank fuse BF, and may generate the used fuse data UFD set to a logic "high" level according to the cut used fuse UF. After the point in time T139, when the boot-up end signal BEND is activated according to the fuse selection signal FS_SEL<2:1> set to have a fourth logic bit set '00', the boot-up period signal BPD may be disabled at a logic "low" level to end the boot-up operation.

As illustrated in FIG. 16, during a period from a point in time T133 to a point in time T135, the used fuse data UFD maintains a logic "low" level, so that the delay selection clock SCLKd generated by delaying the selection clock SCLK by a delay period may be output as a resource pulse RPUL. In synchronization with a first rising edge of the resource pulse RPUL, a first bit PCNT<1> of the pulse counting signal PCNT may transition from a logic "low" level to a logic "high" level. In synchronization with the rising edge of the first bit PCNT<1> of the pulse counting signal PCNT, the first bit RSF<1> of the resource flag RSF transitions from a logic "low" level to a logic "high" level.

As illustrated in FIG. 16, after the point in time T135, the used fuse data UFD is generated at a logic "high" level and the bank fuse data BFD is generated at a logic "low" level, so that the first bit BLAT<1> of the bank latch signal BLAT may transition from a logic "low" level to a logic "high" level. When the first bit RSF<1> of the resource flag RSF is set to have a logic "high" level and the first bit BLAT<1> of the bank latch signal BLAT is set to have a logic "high" level, the logic bit set of the bank resource flag BRSF<2:1> may be set to '10'. When the logic bit set of the bank resource flag BRSF<2:1> is '10', it may mean that the second bit BRSF<2> of the bank resource flag BRSF has a logic "high" level and the first bit BRSF<1> of the bank resource flag BRSF has a logic "low" level. Because the logic bit set of the bank resource flag BRSF<2:1> is set to '10' when the boot-up operation is completed, a repair operation on the second bank (not shown) may be performed. More specifically, in the case of the fuse data generation circuit 115C shown in FIG. 15, because the first fuse set FS1 is unused, it may be confirmed in the boot-up operation that the repair operation on the second bank may be performed using the unused first fuse set FS1.

Figure 17:
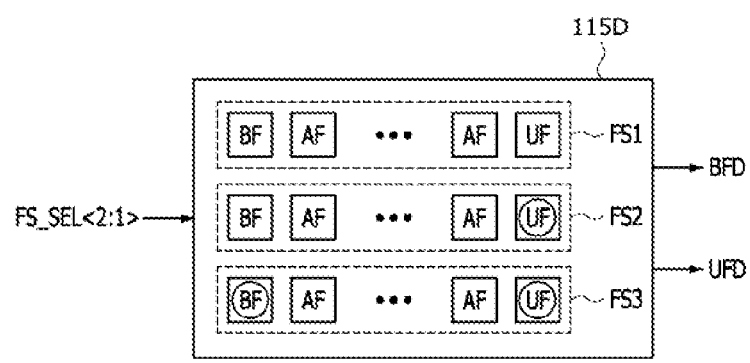
FIG. 17 is a diagram illustrating a configuration according to another example of the fuse data generation circuit included in the semiconductor device illustrated in FIG. 2.

FIG. 17 is a diagram illustrating a configuration of a fuse data generation circuit 115D according to another example of the fuse data generation circuit 115 included in the semiconductor device 13A illustrated in FIG. 2.

As illustrated in FIG. 17, the fuse data generation circuit 115D may include first to third fuse sets FS1~FS3 shared by a first bank (not shown) and a second bank (not shown) for a repair operation. The fuse data generation circuit 115D may sequentially select one of the first to third fuse sets FS1~FS3 based on a fuse set selection signal FS_SEL<2:1>. When the first fuse set FS1 is selected based on the fuse set selection signal FS_SEL<2:1>, the fuse data generation circuit 115D may generate the bank fuse data BFD of a logic "low" level based on the uncut bank fuse BF and may generate the used fuse data UFD of a logic "low" level based on the uncut used fuse UF. When the second fuse set FS2 is selected based on the fuse set selection signal FS_SEL<2:1>, the fuse data generation circuit 115D may generate the bank fuse data BFD of a logic "low" level based on the uncut bank fuse BF and may generate the used fuse data UFD of a logic "high" level based on the cut used fuse UF. When the third fuse set FS3 is selected based on the fuse set selection signal FS_SEL, the fuse data generation circuit 115D may generate the bank fuse data BFD of a logic "high" level based on the cut bank fuse BF and may generate the used fuse data UFD of a logic "high" level based on the cut used fuse UF.

Figure 18:
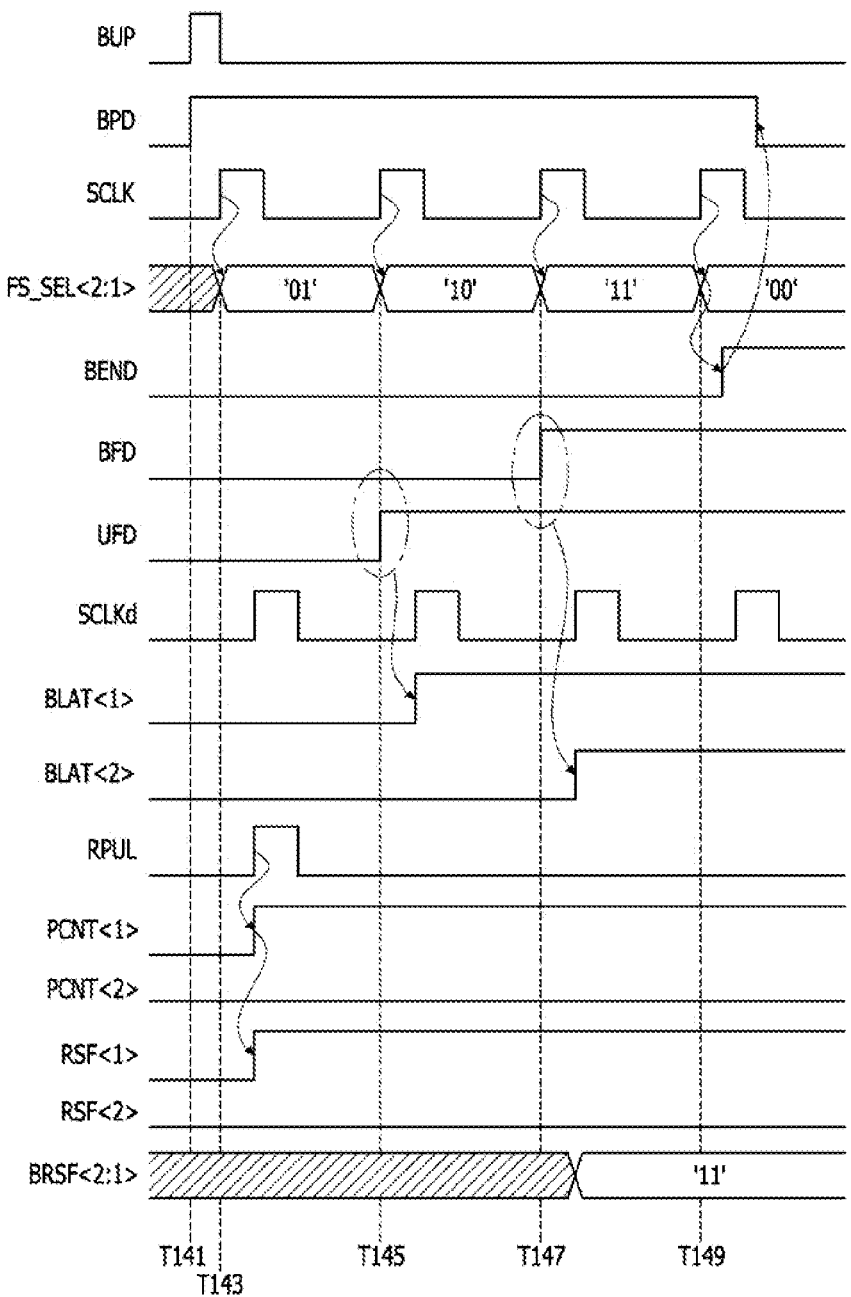
FIG. 18 is a timing diagram illustrating an operation of the semiconductor device including the fuse data generation circuit illustrated in FIG. 17.

FIG. 18 is a timing diagram illustrating an operation of the semiconductor device 13A including the fuse data generation circuit 115D illustrated in FIG. 17.

Referring to FIGS. 17 and 18, when the boot-up pulse BUP is generated for the boot-up operation at a point in time T141, the boot-up period signal BPD is enabled at a logic "high" level so that the boot-up operation may be performed, and the selection clock SCLK may be generated when the boot-up operation is performed. The logic bit set of the fuse selection signal FS_SEL<2:1> may be sequentially changed in synchronization with a rising edge of the selection clock SCLK. During a period from a point in time T143 to a point in time T145, the fuse data generation circuit 115D may receive the fuse selection signal FS_SEL<2:1> set to have a first logic bit set '01' to select the first fuse set FS1 and may generate a bank fuse data BFD and a used fuse data UFD both set to have a logic "low" level according to both uncut bank fuse BF and used fuse UF. During a period from the point in time T145 to a point in time T147, the fuse data generation circuit 115D may receive the fuse selection signal FS_SEL<2:1> set to have a second logic bit set '10' to select the second fuse set FS2, may generate the bank fuse data BFD set to have a logic "low" level according to the uncut bank fuse BF, and may generate the used fuse data UFD set to have a logic "high" level according to the cut used fuse UF. During a period from the point in time T147 to a point in time T149, the fuse data generation circuit 115D may receive the fuse selection signal FS_SEL<2:1> set to have a third logic bit set '11' to select the third fuse set FS3, may generate the bank fuse data BFD set to have a logic "high" level according to the cut bank fuse BF, and may generate the used fuse data UFD set to have a logic "high" level according to the cut used fuse UF. After the point in time T149, when the boot-up end signal BEND is activated according to the fuse selection signal FS_SEL<2:1> set to have a fourth logic bit set '00', the boot-up period signal BPD may be disabled at a logic "low" level to end the boot-up operation.

As illustrated in FIG. 18, because the used fuse data UFD maintains a logic "low" level during the period from the point in time T143 to the point in time T145, a delay selection clock SCLKd generated by delaying the selection clock SCLK by a delay period may be output as the resource pulse RPUL. In synchronization with a first rising edge of the resource pulse RPUL, a first bit PCNT<1> of the pulse counting signal PCNT may transition from a logic "low" level to a logic "high" level. In synchronization with the rising edge of the first bit PCNT<1> of the pulse counting signal PCNT, a first bit RSF<1> of the resource flag RSF may transition from a logic "low" level to a logic "high" level.

As illustrated in FIG. 18, during a period from the point in time T145 to the point in time T147, the used fuse data UFD is generated at a logic "high" level and the bank fuse data BFD is generated at a logic "low" level, so that the first bit BLAT<1> of the bank latch signal BLAT may transition from a logic "low" level to a logic "high" level. After the point in time T147, the used fuse data UFD is generated at a logic "high" level and the bank fuse data BFD is generated at a logic "high" level, so that the second bit BLAT<2> of the bank latch signal BLAT may transition from a logic "low" level to a logic "high" level. When both the first bit BLAT<1> of the bank latch signal BLAT and the second bit BLAT<2> of the bank latch signal BLAT are set to have a logic "high" level while the first bit RSF<1> of the resource flag RSF is set to a logic "high" level, the logic bit set of the bank resource flag BRSF<2:1> may be set to '11'. When the logic bit set of the bank resource flag BRSF<2:1> is '11', it may mean that all of the second bit BRSF<2> of the bank resource flag BRSF and the first bits BRSF<1> of the bank resource flag BRSF have a logic "high" level. When the repair operation is performed after the boot-up operation is completed, because the logic bit set of the bank resource flag BRSF<2:1> is set to '11', a repair operation may be performed on the first bank (not shown) and the second bank (not shown). More specifically, in the case of the fuse data generation circuit 115D shown in FIG. 17, because the repair operation for both the first bank (not shown) and the second bank (not shown) has not been performed, it may be confirmed through the boot-up operation that the unused first fuse set FS1 may be used in the repair operation for the first bank or in the repair operation for the second bank.

Figure 19:
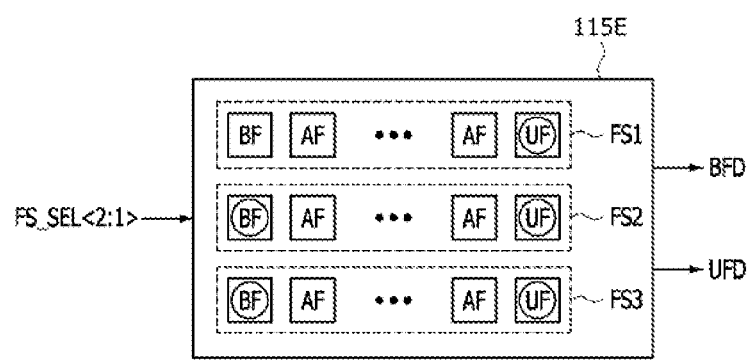
FIG. 19 is a diagram illustrating a configuration according to another example of the fuse data generation circuit included in the semiconductor device illustrated in FIG. 2.

FIG. 19 is a diagram illustrating a configuration of a fuse data generation circuit 115E according to another example of the fuse data generation circuit 115 included in the semiconductor device 13A illustrated in FIG. 2. As illustrated in FIG. 19, the fuse data generation circuit 115E may include first to third fuse sets FS1~FS3 shared by a first bank (not shown) and a second bank (not shown) for a repair operation. The fuse data generation circuit 115E may sequentially select one of the first to third fuse sets FS1~FS3 based on the fuse set selection signal FS_SEL<2:1>. When the first fuse set FS1 is selected based on the fuse set selection signal FS_SEL<2:1>, the fuse data generation circuit 115E may generate the bank fuse data BFD of a logic "low" level based on the uncut bank fuse BF and may generate the used fuse data UFD of a logic "high" level based on the cut used fuse UF. When the second fuse set FS2 is selected based on the fuse set selection signal FS_SEL<2:1>, the fuse data generation circuit 115E may generate the bank fuse data BFD of a logic "high" level based on the cut bank fuse BF and may generate the used fuse data UFD of a logic "high" level based on the cut used fuse UF. When the third fuse set FS3 is selected based on the fuse set selection signal FS_SEL, the fuse data generation circuit 115E may generate the bank fuse data BFD of a logic "high" level based on the cut bank fuse BF and may generate the used fuse data UFD of a logic "high" level based on the cut used fuse UF.

Figure 20:
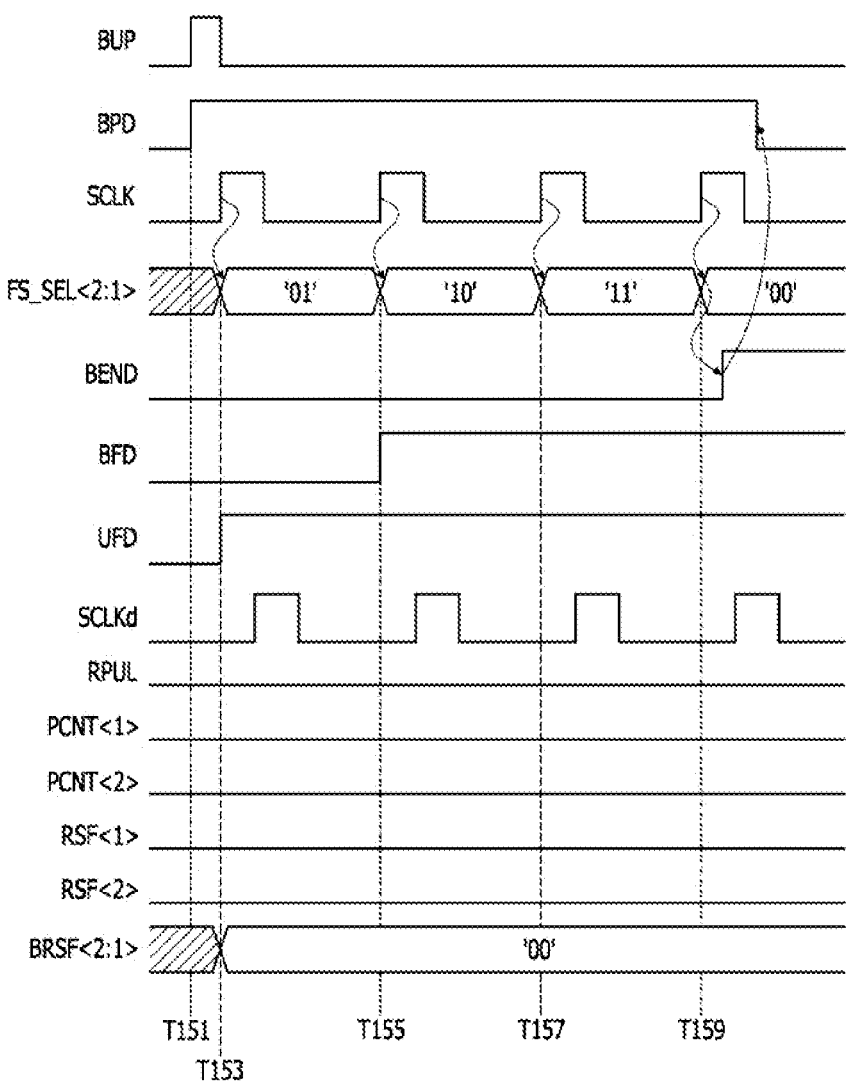
FIG. 20 is a timing diagram illustrating an operation of the semiconductor device including the fuse data generation circuit illustrated in FIG. 19.

FIG. 20 is a timing diagram illustrating an operation of the semiconductor device 13A including the fuse data generation circuit 115E illustrated in FIG. 19.

Referring to FIGS. 19 and 20, when the boot-up pulse BUP is generated for a boot-up operation at a point in time T151, the boot-up period signal BPD is enabled to a logic "high" level so that the boot-up operation may be performed, and the selection clock SCLK may be generated when the boot-up operation is performed. The logic bit set of the fuse selection signal FS_SEL<2:1> may be sequentially changed in synchronization with a rising edge of the selection clock SCLK. During the period from a point in time T153 to a point in time T155, the fuse data generation circuit 115E may receive the fuse selection signal FS_SEL<2:1> set to have a first logic bit set '01' to select the first fuse set FS1, may generate the bank fuse data BFD set to have a logic "low" level according to the uncut bank fuse BF, and may generate the used fuse data UFD set to have a logic "high" level according to the cut used fuse UF. During the period from the point in time T155 to a point in time T157, the fuse data generation circuit 115E may receive the fuse selection signal FS_SEL<2:1> set to have a second logic bit set '10' to select the second fuse set FS2, may generate the bank fuse data BFD set to have a logic "high" level according to the cut bank fuse BF, and may generate the used fuse data UFD set to have a logic "high" level according to the cut used fuse UF. During the period from the point in time T157 to a point in time T159, the fuse data generation circuit 115E may receive the fuse selection signal FS_SEL<2:1> set to have a third logic bit set '11' to select the third fuse set FS3, may generate the bank fuse data BFD set to have a logic "high" level according to the cut bank fuse BF, and may generate the used fuse data UFD set to have a logic "high" level according to the cut used fuse UF. When the boot-up end signal BEND is activated according to the fuse selection signal FS_SEL<2:1> set to have a fourth logic bit set '00' after the point in time T159, the boot-up period signal BPD may be disabled at a logic "low" level to end the boot-up operation.

As illustrated in FIG. 20, after the point in T153, the used fuse data UFD maintains a logic "high" level, and all of the resource pulse RPUL, first bit PCNT<1> of the pulse counting signal PCNT, second bit PCNT<2> of the pulse counting signal PCNT, first bit RSF<1> of the resource flag RSF, and second bit RSF<2> of the resource flag RSF maintain a logic "low" level, so that the logic bit set of the bank resource flag BRSF<2:1> may be set to '00'. When the logic bit set of the bank resource flag BRSF<2:1> is '00', it may mean that all of the second bit BRSF<2> of the bank resource flag BRSF and the first bits BRSF<1> of the bank resource flag BRSF are at a logic "low" level. Because the logic bit set of the bank resource flag BRSF<2:1> is set to '00' when the boot-up operation is completed, a repair operation cannot be performed on the first bank (not shown) and the second bank (not shown). More specifically, because there is no unused fuse set in the fuse data generation circuit 115E shown in FIG. 19, it may be confirmed through the boot-up operation that the repair operation cannot be performed on the first bank (not shown) and the second bank (not shown).

As described above, the semiconductor device 13A according to the present embodiment confirms whether there is at least one fuse set unused for the repair operation among the fuse sets through a boot-up operation, and may secure the repair operation of the bank for which the repair operation are not performed, at least once by using the unused fuse set.

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. A semiconductor device comprising:
a flag generation circuit configured to receive region fuse data and used fuse data which are generated from a fuse set selected based on a fuse set selection signal from among fuse sets and generate a bank resource flag to control a repair operation for a bank on which a repair operation has not been performed, based on the region fuse data and the used fuse data; and
a repair control circuit configured to control a repair operation for banks sharing the fuse sets based on the bank resource flag.

2. The semiconductor device of claim 1,
wherein the flag generation circuit is configured to receive the region fuse data whose logic level is determined according to whether at least one bank fuse included in the selected fuse set is cut.

3. The semiconductor device of claim 1,
wherein the flag generation circuit is configured to receive the region fuse data whose logic level is determined according to which bank the selected fuse set is used for a repair operation among the banks sharing the fuse sets.

4. The semiconductor device of claim 1,
wherein the flag generation circuit is configured to receive the used fuse data whose logic level is determined according to whether the used fuse included in the selected fuse set is cut.

5. The semiconductor device of claim 1,
wherein the flag generation circuit is configured to receive the used fuse data whose logic level is determined according to whether the selected fuse set has been used for a repair operation of one of the banks sharing the fuse sets.

6. The semiconductor device of claim 1,
wherein the flag generation circuit is configured to generate, when there is at least one fuse set unused for the repair operation among the fuse sets, the bank resource flag so that the unused fuse set is used for the bank on which the repair operation has not been performed among the banks sharing the fuse sets.

7. The semiconductor device of claim 1, wherein the flag generation circuit includes:
a bank latch signal generation circuit configured to extract information on at least one bank on which a repair operation has been performed based on the region fuse data and the used fuse data, and generate a bank latch signal corresponding to the bank on which the repair operation has been performed;

a resource flag generation circuit configured to extract information on the fuse set unused in the repair operation based on the used fuse data and generate resource flags corresponding to the number of unused fuse sets; and a bank resource flag generation circuit configured to generate the bank resource flag based on the bank latch signal and the resource flag.

8. The semiconductor device of claim 1, wherein the flag generation circuit includes:

a bank pulse generation circuit configured to generate a bank pulse from a delay selection clock based on the region fuse data and the used fuse data;

a bank latch signal generation circuit configured to generate a bank latch signal based on the bank pulse;

a resource pulse generation circuit configured to generate a resource pulse from the delay selection clock based on the used fuse data;

a pulse counter configured to count the resource pulse to generate a pulse counting signal;

a resource flag generation circuit configured to generate a resource flag based on the pulse counting signal; and a bank resource flag generation circuit configured to generate the bank resource flag based on the bank latch signal and the resource flag.

9. The semiconductor device of claim 1, wherein, when the repair operation is performed, the repair control circuit is configured to:

extracts a failure bank address and a failure address from an internal address; and store the failure address in a fuse set corresponding to the bank resource flag based on the failure bank address and the bank resource flag.

10. The semiconductor device of claim 1, wherein the repair control circuit includes:

an address extraction circuit configured to extract a failure bank address and a failure address from an internal address based on a mode signal and an internal address;

a rupture enable signal generation circuit configured to generate a rupture enable signal based on the failure bank address and the bank resource flag; and a rupture control circuit configured to perform a rupture operation of storing the failure address in one of the fuse sets based on the rupture enable signal.

11. The semiconductor device of claim 1, further comprising a fuse data generation circuit including a plurality of fuse sets each including at least one bank fuse, at least one address fuse, and a used fuse, wherein the fuse data generation circuit is configured to generate the region fuse data and the used fuse data.

12. The semiconductor device of claim 1, further comprising a fuse set selection control circuit configured to generate the fuse set selection signal for sequentially selecting the fuse sets in synchronization with a selection clock during a boot-up operation.

13. A semiconductor device comprising:

a fuse data generation circuit configured to include a plurality of fuse sets each including at least one bank fuse, at least one address fuse, and a used fuse, and configured to generate region fuse data and used fuse data from a fuse set selected by a fuse set selection signal among the fuse sets;

a flag generation circuit configured to generate a bank resource flag to control a repair operation for a bank on which a repair operation has not been performed, based on the region fuse data and the used fuse data; and a repair control circuit configured to control a repair operation for banks sharing the fuse sets based on the bank resource flag.

14. The semiconductor device of claim 13, wherein the fuse data generation circuit is configured to generate the region fuse data whose logic level is determined according to whether the at least one bank fuse included in the selected fuse set is cut.

15. The semiconductor device of claim 13, wherein the fuse data generation circuit is configured to generate the region fuse data whose logic level is determined according to which bank the selected fuse set is used for the repair operation among the banks sharing the fuse sets.

16. The semiconductor device of claim 13, wherein the fuse data generation circuit is configured to generate the used fuse data whose logic level is determined according to whether the used fuse included in the selected fuse set is cut.

17. The semiconductor device of claim 13, wherein the fuse data generation circuit is configured to generate the used fuse data whose logic level is determined according to whether the selected fuse set is used for a repair operation of one of the banks sharing the fuse sets.

18. The semiconductor device of claim 13, wherein the fuse data generation circuit is configured to generate, when there is at least one fuse set unused in the repair operation among the fuse sets, the bank resource flag so that the unused fuse set is used for a bank on which the repair operation has not been performed among the banks sharing the fuse sets.

19. The semiconductor device of claim 13, further comprising a repair control circuit configured to:

extract a failure bank address and a failure address from an internal address when the repair operation is performed; and store the failure address in a fuse set corresponding to the bank resource flag based on the failure bank address and the bank resource flag.

20. The semiconductor device of claim 13, further comprising a fuse set selection control circuit configured to generate the fuse set selection signal for sequentially selecting the fuse sets in synchronization with a selection clock when a boot-up operation is performed.

* * * * *